(12) United States Patent
Boone et al.

(10) Patent No.: US 8,664,756 B2
(45) Date of Patent: Mar. 4, 2014

(54) RECONSTITUTED WAFER PACKAGE WITH HIGH VOLTAGE DISCRETE ACTIVE DICE AND INTEGRATED FIELD PLATE FOR HIGH TEMPERATURE LEAKAGE CURRENT STABILITY

(75) Inventors: Mark R. Boone, Gilbert, AZ (US); Mohsen Askarinya, Chandler, AZ (US); Larry E. Tyler, Mesa, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 13/556,385

(22) Filed: Jul. 24, 2012

(65) Prior Publication Data

US 2014/0027889 A1 Jan. 30, 2014

(51) Int. Cl.
*H01L 23/02* (2006.01)
*H01L 23/552* (2006.01)
*H01L 23/48* (2006.01)

(52) U.S. Cl.
USPC ............ 257/678; 257/660; 257/685; 257/778

(58) Field of Classification Search
USPC .................. 257/678, 660, 685, 778; 438/106; 361/757
See application file for complete search history.

(56) References Cited

U.S. PATENT DOCUMENTS

| | | | |
|---|---|---|---|
| 5,371,404 A | 12/1994 | Juskey et al. | |
| 5,808,878 A | 9/1998 | Saito et al. | |
| 6,103,551 A | 8/2000 | Ono et al. | |
| 6,489,669 B2 | 12/2002 | Shimada et al. | |
| 6,521,978 B2 | 2/2003 | Fenk et al. | |
| 6,720,662 B1 | 4/2004 | Den | |
| 6,836,022 B2 | 12/2004 | Boone et al. | |
| 7,041,576 B2 | 5/2006 | Pozder et al. | |
| 7,557,437 B2 | 7/2009 | Yang et al. | |
| 7,901,989 B2 | 3/2011 | Haba et al. | |
| 2002/0180062 A1* | 12/2002 | Hsieh et al. | 257/778 |
| 2003/0001251 A1* | 1/2003 | Cheever et al. | 257/685 |
| 2004/0159956 A1* | 8/2004 | Boone et al. | 257/778 |
| 2006/0019484 A1* | 1/2006 | Chen et al. | 438/618 |
| 2007/0197018 A1* | 8/2007 | Chen et al. | 438/618 |
| 2008/0105967 A1* | 5/2008 | Yang et al. | 257/690 |

(Continued)

FOREIGN PATENT DOCUMENTS

| | | |
|---|---|---|
| WO | 94/18707 A1 | 8/1994 |
| WO | 01/15225 A1 | 3/2001 |
| WO | 2011/108327 A1 | 9/2011 |

OTHER PUBLICATIONS (PCT/US2012/049690) PCT Notification of Transmittal of the International Search Report and the Written Opinion of the International Searching Authority, Mailed Oct. 26, 2012, 10 pages.

*Primary Examiner* — Long K Tran
*Assistant Examiner* — Dzung Tran
(74) *Attorney, Agent, or Firm* — Evans M. Mburu

(57) ABSTRACT

A reconstituted wafer level package for a versatile high-voltage capable component is disclosed. The reconstituted wafer package includes a dice substantially encapsulated by a mold material except for a first face. A dielectric layer is disposed on the first face of the dice. The package further includes an array of ball bumps formed on an exterior facing portion of the dielectric layer. Further, a field plate is disposed within the dielectric material and interposed between the first face of the dice and the ball bump array. The field plate may be spaced from the dice by a predetermined distance to prevent dielectric breakdown of the material of the dielectric layer.

19 Claims, 5 Drawing Sheets

(56) References Cited

U.S. PATENT DOCUMENTS

| | | |
|---|---|---|
| 2008/0237855 A1* | 10/2008 | Fan et al. .................. 257/738 |
| 2009/0012144 A1 | 1/2009 | Plant et al. |
| 2009/0160065 A1 | 6/2009 | Haba et al. |
| 2009/0261468 A1 | 10/2009 | Kooeninger et al. |
| 2009/0302439 A1* | 12/2009 | Pagaila et al. .................. 257/660 |
| 2011/0121449 A1 | 5/2011 | Lin et al. |
| 2011/0156250 A1 | 6/2011 | Goh et al. |

* cited by examiner

RECONSTITUTED WAFER PACKAGE WITH HIGH VOLTAGE DISCRETE ACTIVE DICE AND INTEGRATED FIELD PLATE FOR HIGH TEMPERATURE LEAKAGE CURRENT STABILITY

FIELD

This disclosure relates generally to implantable medical devices (IMDs), and more particularly to a miniaturized circuit module configured to occupy a small space within the IMD housing to further effect the miniaturization thereof.

BACKGROUND

A wide variety of IMDs that employ electronic circuitry for providing electrical stimulation of body tissue and/or monitoring a physiologic condition are known in the art. Such IMDs may deliver electrical therapy energy in the form of shocking energy and stimulating pulses to selected body tissue and typically comprise output circuitry for generating the electrical energy under prescribed conditions and at least one lead bearing a stimulation electrode for delivering the electrical energy to the selected tissue. For example, cardiac pacemakers and implantable cardioverter-defibrillators (ICDs) have been developed for maintaining a desired heart rate during episodes of bradycardia or for applying cardioversion or defibrillation therapies to the heart upon detection of serious arrhythmias. Other nerve, brain, muscle and organ tissue stimulating medical devices are also known for treating a variety of conditions.

Currently available IMDs, including ICDs and implantable pulse generators (IPGs), are typically formed having a metallic housing that is hermetically sealed and, therefore, is impervious to body fluids, a header or connector assembly mounted to the housing for making electrical and mechanical connection with one or more leads, and possess telemetry capabilities for communicating with external devices. Over the past 20 years, the IMDs have evolved from relatively bulky, crude, and short-lived devices to complex, long-lived, and miniaturized IMDs that are steadily being miniaturized with their functionality continuously increasing. For example, numerous improvements have been made in cardioversion/defibrillation leads and electrodes that have enabled the cardioversion/defibrillation energy to be precisely delivered about selected upper and lower heart chambers and thereby dramatically reducing the delivered shock energy required to cardiovert or defibrillate the heart chamber. Moreover, the high voltage output circuitry has been improved in many respects to provide monophasic, biphasic, or multiphase cardioversion/defibrillation shock or pulse waveforms that are efficacious, sometimes with particular combinations of cardioversion/defibrillation electrodes, in lowering the required shock energy to cardiovert or defibrillate the heart.

The miniaturization of IMDs is driving size and cost reduction of all IMD components including the electronic circuitry components, where it is desirable to increase the density and reduce the size so that the overall circuitry can be more compact. As the dimensions of the IMDs decreases, the electronic circuits of the IMD circuitry are preferably formed as integrated circuits in order to fit within a minimal space. Furthermore, as the dimensions of the components are also shrinking, it is desirable to improve the use of the dimensions within the IMD package.

One response to this desire has been through technological improvements to the packaging for the dice in which the output circuitry is included through such packaging techniques as the reconstituted wafer packaging. In particular, development efforts in reconstituted wafer packaging, also known as fan out wafer level packaging, focus on producing thinner and smaller electronic packages. However, there are significant technical barriers to developing and packaging a versatile high voltage dice such as those used in the aforementioned IMDs. Accordingly, it is desirable to provide an improved reconstituted wafer level package and an improved reconstituted wafer level package for high voltage components.

SUMMARY

In general, exemplary embodiments of the present disclosure describe a reconstituted wafer level package for a versatile high-voltage capable component. The reconstituted wafer level package of the present disclosure promotes off-state leakage current stability for a high-voltage component where the instability may manifest itself as static leakage current at room temperature or high temperature leakage instability and leakage runaway. As such, a planar termination structure, such as a field termination ring, can be employed for high voltage components packaged in a reconstituted wafer level package.

In one embodiment, the reconstituted wafer package includes a dice substantially encapsulated by a mold material except for a first face and with one or more dielectric layers disposed on the first face. The package further includes an array of ball bumps formed on an exterior facing portion of the dielectric layer and a field plate interposed between the first face of the dice and ball bump array, for example, within the dielectric material.

In an embodiment, the dice may further include a field termination ring. In accordance with the foregoing embodiment, the width of the field plate may approximate the width of the field termination ring on the dice. In an embodiment, the field plate substantially or completely overlaps the field termination ring. A minimum predetermined spacing may be maintained between the field plate and the field termination ring.

In an embodiment, the field plate may be biased with a polarity that promotes accumulation of majority carriers at the surface of the surface at the field termination ring.

The foregoing summary information is intended to merely illustrate some of the aspects and features of the present disclosure and is not meant to limit the scope in any way. In fact, upon review of the foregoing and the following described and depicted embodiments, one of skill in the art will surely recognize insubstantial modifications or extensions of the disclosure each of which is expressly intended to be covered hereby. The disclosure is also not limited to the specific-described embodiments; rather, the constituent elements in each embodiment may be combined as appropriate and the combination thereof may effectively serve as an embodiment of the present disclosure. Such embodiments along with modifications are also within the scope of the present disclosure.

DETAILED DESCRIPTION

Figure 1:
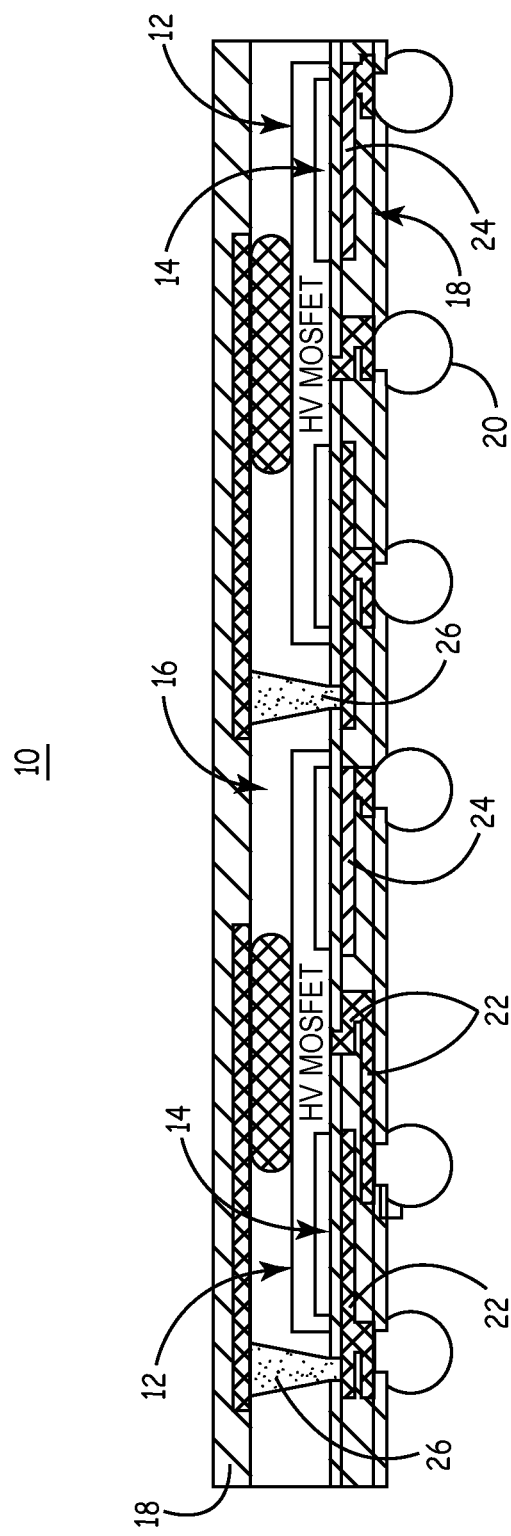
FIG. 1 is a cross-sectional view illustrating an electronic package in accordance with principles of this disclosure.

While the present disclosure is susceptible of embodiment in many different forms, there is shown in the drawings and will be described herein in detail specific embodiments thereof with the understanding that the disclosure is to be considered as an exemplification of the principles of the disclosure and is not intended to be limited to the specific illustrative embodiments. The detailed description is to be read with reference to the figures, in which like elements in different figures have like reference numerals. For the purposes of clarity, the same reference numbers are used in the drawings to identify similar elements. Various changes to the described embodiments may be made in the function and arrangement of the elements described herein without departing from the scope of the disclosure. Furthermore, there is no intention to be bound by any theory presented in the preceding background or the following detailed description.

Microelectronic elements, such as semiconductor chips, are flat bodies with electrical connection contacts disposed on an exterior surface that are connected to the internal electrical circuitry of the element itself. Microelectronic elements are typically packaged to form microelectronic packages, or assemblies, having a surface that is surface mountable with terminals that electrically connect to the element's internal contacts. The package or assembly may then be connected to test equipment to determine whether the packaged device conforms to a desired performance standard. Once tested, the package may be connected to a larger circuit, e.g., a circuit in an electronic product such as an implantable medical device.

The package or assembly for such microelectronic elements may include the reconstituted wafer level packages discussed in the present disclosure. One benefit of the reconstituted wafer level package of the subject disclosure is that the package provides increased area for each die for "back end" processes, such as the formation of contacts at a scale or pitch that is compatible with circuit board limitations, without sacrificing valuable real estate on the original wafer.

FIG. 1 illustrates an electronic package in accordance with principles of this disclosure. The package 10 may include one or more dice 12, such as the aforementioned high voltage dice used in an implantable medical device (not shown). Although the die in FIG. 1 are illustrated as being on the same plane, it should be understood that the die may alternatively be arranged in a stacked relationship. High voltage dice refers to an electronic component or device that is operable with a potential greater than about 50 volts across any two electrical terminals or contacts of the component. Such high voltage components may be further operable at DC voltages greater than about 100 volts, and even further may be operable at DC voltages greater than about 500 volts, 1000 volts, 1600 volts, 3000 volts and even greater, perhaps in the tens of thousands or more volts. High voltage die may include devices such as Field Effect Transistors (FETs), Metal Oxide Semiconductor (MOS) FETs (MOSFETs), Insulated Gate FETs (IGFETs), thyristors, bipolar transistors, diodes, MOS-controlled thyristors, resistors, capacitors, etc. The dice 12 include a field termination ring 14. Field termination ring 14 may be formed as a unitary ring or may comprise a plurality of concentric rings.

Package 10 further includes a mold compound encapsulant 16, dielectric layer 18, and a ball bump array including individual ball bumps 20. The materials for forming the mold compound encapsulant 16 are known in the art and include materials of the UV curing type or heat curing type, such as BCB, epoxy, and epoxy resins such as the SINR3170, siloxane resin, manufactured by Shin-Etsu Chemical Co., Ltd., Japan. In an embodiment, the encapsulant 16 is similar to the epoxy material commonly used to form conventional semiconductor packages. The dice 12 are embedded in the encapsulant 16 with at least one face of the dice being exposed for connection to the individual ball bumps 20.

A dice 20 will typically have at least one active side face. As used in this disclosure, an active side face refers to a portion, generally residing on a planar face, on which are disposed electrical connection contacts (or pins or terminals) for electrically connecting the dice to external (or internal) components. In the embodiment, dice 12 have active front-side and back-side faces that are coupled to the individual ball bumps 20 through conductive traces 22. The individual ball bumps 20 overly an exterior face of the package 10, such as an exterior facing side of dielectric layer 18. For connection to the active back-side faces of die 12, the package 10 may also include vias 26 formed within the encapsulant 16. The number of vias 26 formed within the encapsulant 16 will typically be dictated by the number of electrical terminals that reside on a face (generally, other than the front-side face). The conductive traces 22 may be formed from an electrically conductive material including for example, Aluminium (Al), Nickel (Ni), Copper (Cu), Silver (Ag), and Silicon (Si) among others.

Dielectric layer 18 is formed from an insulative material that provides electrical isolation between the various electrically conductive traces 22. For convenience and without intending to be limiting, the illustration depicts dielectric layer 18 as a monolithic (single) layer. Those skilled in the art of semiconductor fabrication will appreciate that dielectric layer 18 may suitably be formed from a plurality of layers and each may be formed from different materials. As shown in FIG. 1, dielectric layer 18 may be formed in alignment with a plurality of planar surfaces, with respect to dice 12. In alternative embodiments, dielectric layer 18 resides on a plane corresponding with only one of the surfaces of dice 12 as will be described in the example embodiment of FIGS. 2-5.

With continued reference to FIG. 1, package 10 includes a field plate 24 that is preferably formed within dielectric layer 18. As is shown in the figure, the field plate 24 is interposed between ball bump array and the dice 12. In accordance with one embodiment, the field plate 24 is spaced from dice 12 at an optimal spacing gap that is large enough to prevent dielectric breakdown of the insulator, but close enough to set up a strong enough field to dominate the system. The optimal distance for the spacing gap is maintained by embedding the field plate 24 within the dielectric layer 18 and it may be determined based on the characteristics of the dielectric material and the test and/or operating conditions for the dice 12. In one example embodiment, the characteristics taken into account may include the operating conditions of package 10 including such things as the operating voltage and temperature with regards to the breakdown characteristics for the dielectric material. In another example embodiment, the distance of the spacing gap between field plate 24 and dice 12 may alternatively or in addition be determined based on the dielectric strength of the material used for formation of dielectric layer 18. This spacing gap may range from approximately 25 μm to approximately 300 μm depending on the operating and/or test parameters for a given component. The controlling factor in the design and selection of a spacing gap is that the field plate 24 will be effective up to the maximum breakdown strength of the dice 12 to prevent field effect leakage at room temperature and higher temperatures. As an example, a 1000V MOSFET intended to operate at 80 percent rated voltage at 125 degrees C. should have field plate 24 spaced apart at a distance in the range of 50 to 200 μm from the field termination ring 18. As another example, a spacing of approximately 50 μm to approximately 75 μm is preferred to prevent dielectric breakdown and ensure current stability for a dice to be operated at 80 percent of its rated 1600V and up to 150 degree C. during a high temperature leakage current test. Therefore, for a given dielectric material, the higher the voltage rating of the component the greater the spacing gap between the dice 12 and field plate 24 to prevent dielectric breakdown and ensure leakage current stability and eliminate or substantially prevent field effect leakage at room temperature. Moreover, positioning the field plate 24 within the dielectric layer 18 will permit the dimensions of the individual ball bumps 20 (or ball bump array) to be determined independently of the spacing requirements for the field plate 24.

In some embodiments, the field plate 24 substantially overlaps the surface area of the field termination ring 14, which is to say that a majority of the surface area of the field plate 24 overlaps with a majority of the surface area of the field termination ring 14. As an illustration of the embodiments, the proportion comprising a majority may be 51%, or 75% or 85% or 98% or any variants within those percentages. In another embodiment, the surface area of the field plate 24 may extend beyond the surface area of the field termination ring 14. In an embodiment, the field plate 24 may be dimensioned to be substantially co-extensive with a surface area of the front-side face of the dice 12. In another embodiment, the dimensions of field plate 24 may be determined based on the planar surface area of the field termination ring 14. As such, field plate 24 has a surface area that is at least the size of the surface area of field termination ring 14. Alternatively, if there is a plurality of concentric field termination rings 14, field plate 24 may either be formed in a corresponding plurality of separate field plates each have a surface area of its respective field termination ring or as a single field plate 24 with a surface area approximating that of the total annular ring comprising the concentric termination rings. In the exemplary embodiments where the surface area of field plate 24 is dimensioned based on the size of the field termination ring 14, the field plate 24 surface area may be coextensive with the surface area of field termination ring 14 and/or may extend beyond the surface area of field termination ring 14. Additionally, the field plate 24 is aligned with or positioned directly underneath or in generally the same vertical plane as the field termination ring 18.

In the absence of the field plate 24, the inventors of the present disclosure observed that the dominant field exists across field termination ring 14. As such, the structure of package 10 is configured to provide a dominant electric field between dice 12 and field plate 24 in order to establish the aforementioned dominant field. The field between dice 12 and field plate 24 may create polarization of the material of dielectric layer 18 towards field plate 24. It also may attract ions towards field plate 24 and away from the surface of dice 12, and generate a vertical electric field that promotes a light accumulation layer to form at the surface of dice 12. In this manner, the formation of the inversion layer at the surface of dielectric layer 18 may be reduced or eliminated, and leakage current stability may be achieved.

In one exemplary embodiment, field plate 24 is configured to receive a biasing voltage to produce an electric field between dice 12 and field plate 24. The biasing voltage preferably has a magnitude at least as great as the magnitude of the biasing voltage applied to dice 12, the voltages having the same polarity. For example, for a package 10 with an N-type substrate, a positive biasing voltage is applied to field plate 24, the positive biasing voltage preferably having a magnitude at least as great as the magnitude of the most positive biasing voltage applied to dice 12. Similarly, for a package 10 having a P-type substrate, a negative biasing voltage is applied to field plate 24, the negative biasing voltage preferably having a magnitude at least as great as the magnitude of the most negative biasing voltage applied to dice 12. Field plate 24 may be connected directly to a terminal of dice 12 if the component has unidirectional blocking characteristics, such as MOSFETs and diodes. However, if dice 12 has bidirectional blocking, such as a thyristor, the voltage on field plate 24 should be switched. In either case, field plate 24 is biased with a polarity that promotes accumulation of majority carriers at the surface of the lightly doped surface region at the field termination ring 14.

Figure 2:
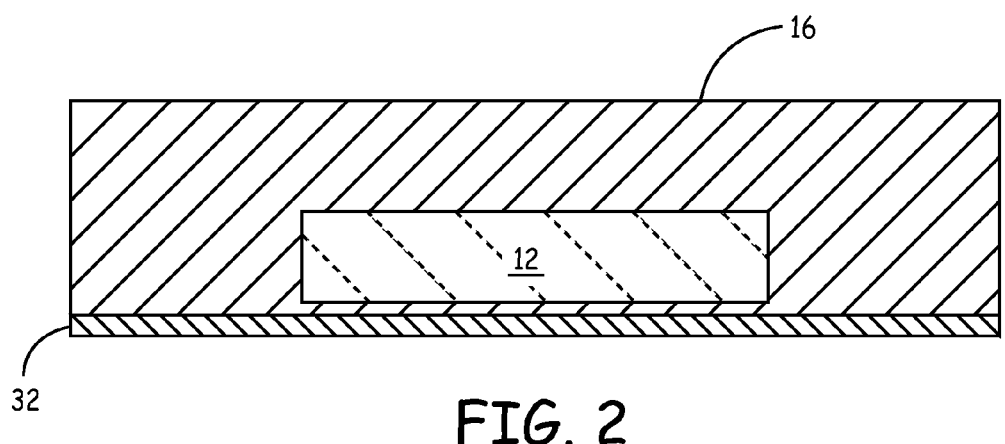
FIGS. 2-5 illustrate one exemplary embodiment of a method of manufacturing a reconstituted wafer level package.

An illustrative method of manufacturing an embodiment of a reconstituted wafer level package 10 is outlined with reference to FIGS. 2-5. As shown in FIG. 2, dice 12 is individually positioned with the front-side face 30 contacting an adhesive tape 32. A liquid molding compound is deposited over the dice 12 and subjected to a compression molding process during which the compound is cured into a hard layer encapsulant 16.

Figure 3:
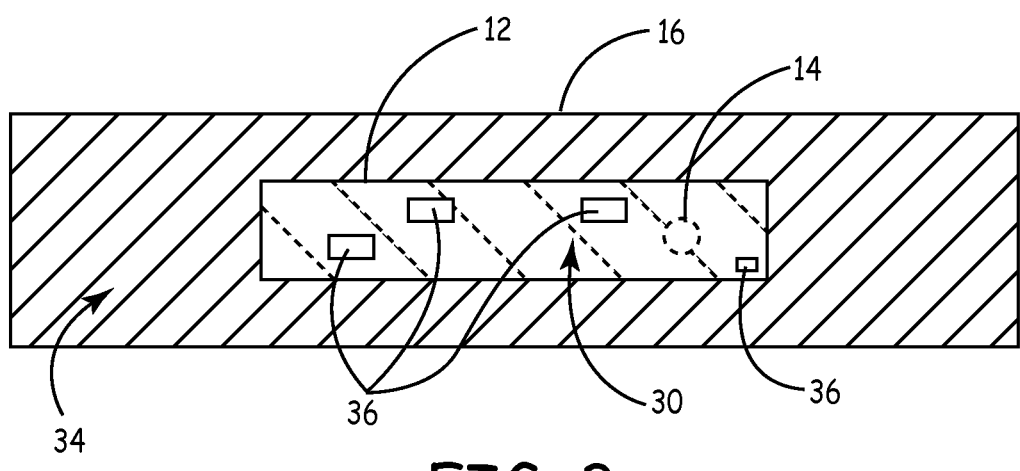
Figure 4:
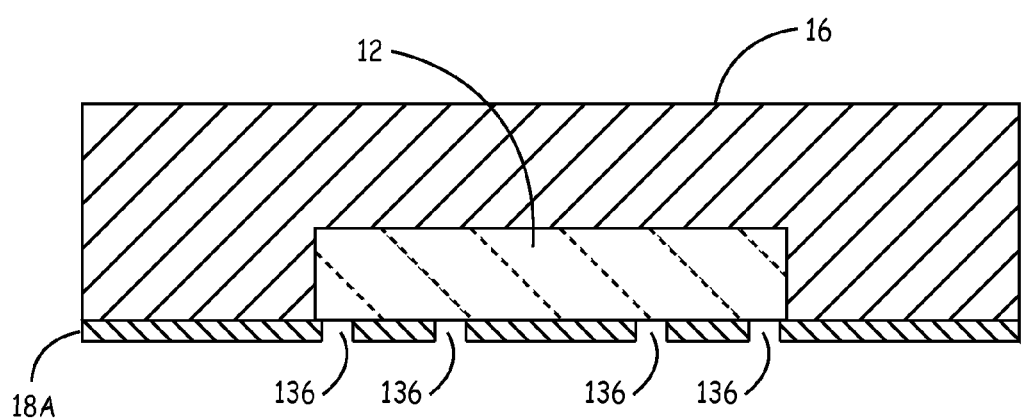

With reference to FIG. 3, the tape 32 is removed after curing of the molding compound, leaving the encapsulant 16 with a top surface 34 in which the dice 12 is embedded with the dice's front-side face 30 being exposed for back end processing such as the aforementioned fanned-out connections. As shown in FIG. 4, a first dielectric layer 18A is deposited over the front-side face 30 and patterned 136 to expose contact pads 36 of the dice 12.

In the conventional reconstituted wafer level packaging process, the contact pads are directly coupled to conductive material as described, for example, in U.S. Pat. No. 7,557,437 issued to Yang et al. on Jul. 7, 2009 and entitled, "Fan out type wafer level package structure and method of the same," which is hereby incorporated by reference. However, there are significant drawbacks to providing such coupling for a high-voltage component such as those contemplated for use with the present disclosure. In particular, the inventors of the present disclosure have discovered that the conventional reconstituted wafer level packaging results in significant failure for high voltage devices and this failure has been identified as stemming from an incompatibility of the planar termination or "field termination ring" with the structure of the conventional reconstituted wafer level package.

Without intending to be bound by theory, it is believed that, at elevated temperatures, typically temperatures greater than about 80 degrees C., the dielectric layer 18A may begin to approach its glass-transition temperature. Dielectric layer 18A may lose hardness, and the molecules may be free to move or rotate within the material. This may allow the molecules of the dielectric layer 18A to become polarized in the presence of a strong electric field. The mobility of free ionic contaminants in dielectric layer 18A also may be increased as the material softens with increases in temperature. The high-voltage devices have very low substrate doping and are very sensitive to external electric fields which can cause accumulation or inversion of charge carriers in the silicon, and affect their off-state leakage. Such phenomena may cause detrimental electrical performance changes, such as, for example, leakage current that can cause a device in the off-state to switch to the on-state.

For additional background on the general field of endeavor and context of the present disclosure, U.S. Pat. No. 6,836,022 issued to Boone et al. on Dec. 28, 2004 and entitled, "High voltage flip-chip component package and method for forming the same," is hereby incorporated by reference herein. An excerpt from the '022 patent follows to aid the reader in understanding certain aspects of the present disclosure as well as related and inherent aspects thereof. When dice 12 is in the "off-state" and a voltage is applied across main electrical terminals, an electric field may develop across field termination ring 14. An electric fringing field may extend from the surface of dice 12 into dielectric layer 18A. The polar components of dielectric layer 18A may orient themselves as dictated by the direction and polarity of the electric fringing field. Any free ions may move through dielectric layer 18A as dictated by the polarity of their charge and the direction of the electric fringing field. The ions may then accumulate at the surface of dice 12 if the electric fringing field is applied continuously at an elevated temperature. The additional electric field set up by polarization of dielectric layer 18A or accumulation of ionic charge may have a negative effect on the performance of dice 12. As dielectric layer 18A polarizes and the charge accumulates, the additional electric fields may terminate on charge carriers in dice 12 and create an inversion layer at the surface of dice 12 that may form a leakage path across field termination ring 14. This may cause dice 12 to gradually switch from the "off-state" to the "on-state."

In the high-voltage devices packaged in accordance with conventional reconstituted wafer level packaging, these problems manifest themselves as static leakage current at room temperature (in the case of a parasitic "field" device being created by conductors close to the dice surface), or high temperature leakage instability and leakage runaway (caused by polarization of the dielectric layer, or mobile ions within the dielectric). As such, the packaging structure of the present disclosure provides compatibility for the discrete high voltage dice, with both planar and mesa type high voltage termination structures.

To address the aforementioned problems, a field plate 24 is disposed within the dielectric layer 18. In particular, a conductive material is deposited onto dielectric layer 18A to form the field plate 24. The spacing requirements for the separation between field plate 24 and dice 12 are maintained by controlling the width of the dielectric layer 18A. In one embodiment, the spacing requirement is only maintained for the portion on the dielectric layer 18A on which the formed field plate 24 will abut if the field plate 24 does not also overlay/overlap the entire surface area of dielectric layer 18A. In a preferred embodiment, the field plate 24 is formed to span or be co-extensive with the surface area of the field termination ring 14. Of course, the surface area and geometry may be formed to meet the dimensions discussed in other preceding embodiments. Unlike the conventional approach, such as that discussed in the '022 patent, interposing the field plate 24 in a location between the dielectric layer and the dice facilitates the decoupling of the ball bump 20 height to the spacing between the field plate 24 and the field termination ring 14.

Figure 5:
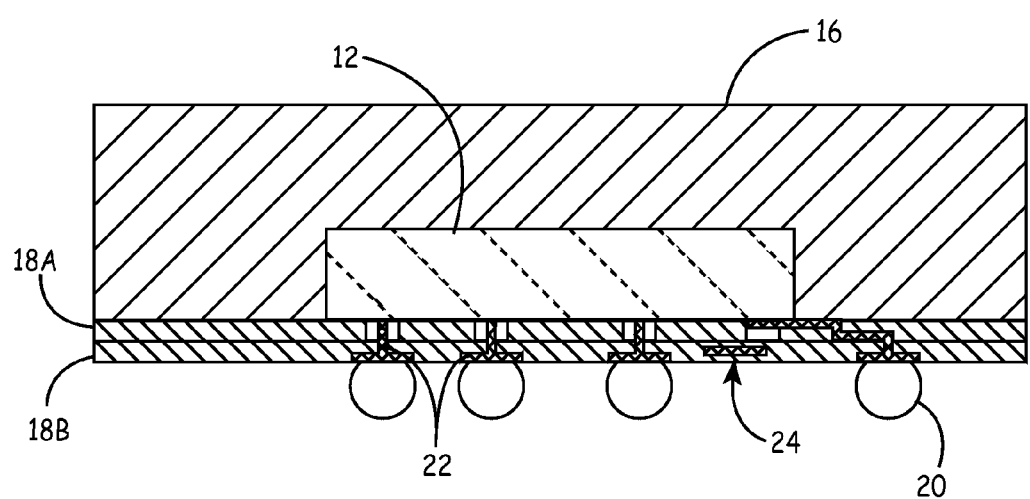

With continued reference to FIG. 5, the conductive traces 22 are then formed by depositing a conductive material over the dielectric layer 18A. The conductive material is then patterned to form the conductive traces 22. A second dielectric layer 18B is deposited and patterned, and additional conductive traces 22 are formed terminating at contact pads 36. Ball bumps 20 are formed on the contact pads 36 to provide the new fanned-out external connection terminals.

The reconstituted wafer level packaging configuration of the present disclosure enables a wafer-scale packaged active high-voltage die to operate at burn in temperature with stable off-state leakage current, and be free from "field effect" leakage caused by routing redistribution metal traces over the field ring structures. Accordingly, the inventors hypothesize that a favorable electric field will be set up by the field plate formed over the dice's field termination ring. The field plate 24 may be tied to the most dominant (positive or negative) voltage applied to the dice 12, such for example as the drain terminal of a MOSFET. This will set up an electric field between the charge carriers in the substrate that will repel holes and cause a soft accumulation of electrons to prevent inversion. In doing so, redistribution traces can be run over the field plate without affecting the field termination ring structure. Under high temperature operation, the field plate will set up a dominant field that will override the fields created by either dielectric insulator polarization or mobile charge accumulation. The field plate preferably overlaps the majority of the field ring structure on the die, and is spaced apart to set up a dominant field that will override the effect of the fringing field from the field ring structure.

Those skilled in the art will appreciate that, among other things and in contrast to the conventional packaging structures such as that described in the '022 package, the present disclosure enables decoupling of the spacing between the field plate and the field termination ring. In other words, the considerations for the spacing between the field plate and the field termination ring can be made independent from the dimension requirements for the bumps. This decoupling presents a significant advantage in that the field plate-to-field termination ring spacing does not impact the dimensions of the bumps which thereby eliminates a substantial design constraint.

In the case of a bidirectional blocking application, high voltage diodes can be used to switch the most positive polarity to the field plate. This field plate feature will make the performance of the dice 12 insensitive to the characteristics of the dielectric 18 used for the wafer-scale package for instance. This would enable the package to be high voltage compatible. The addition of the biased field plate structure compensates for poor dielectric characteristics, and allows the most process favorable material to be used.

Although specific embodiments have been illustrated and described, those skilled in the art will appreciate that various modifications may be made without departing from what is intended to be limited solely by the appended claims. Accordingly, the claims are not limited by the disclosure. The benefits, advantages, solutions to problems, and any element(s) that may cause any benefit, advantage, or solution to occur or become more pronounced are not to be construed as a critical, required, or essential features or elements of any or all of the claims. As used herein, the terms "comprises," "comprising," "having," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A reconstituted wafer package comprising:
    a dice having a plurality of electrical connections;
    a first material encapsulating the dice except for a first surface;
    a dielectric layer formed on at least a portion of the first surface of the dice, the dielectric layer including openings for contact to the plurality of electrical connections;
    a plurality of conductive traces disposed within the dielectric layer and having first and second endpoints, wherein the first endpoint of each of said plurality of conductive traces is in contact with a respective one of each of said electrical connections;
    a plurality of bumps disposed on the dielectric layer, wherein each of the plurality of bumps is coupled to the second endpoints; and a field plate disposed within the dielectric layer and interposed between the dice and the plurality of bumps, wherein the field plate is spaced apart from the dice by a predetermined distance.

2. The reconstituted wafer package of claim 1, wherein the dice further includes a field termination ring and the field plate is positioned below the field termination ring.

3. The reconstituted wafer package of claim 1, wherein the dice further includes a field termination ring having a first surface area and wherein the field plate has a second surface area that is at least coextensive with the field termination ring.

4. The reconstituted wafer package of claim 1, wherein the dice further includes a field termination ring and the field plate is dimensioned to substantially overlap the field termination ring.

5. The reconstituted wafer package of claim 2, wherein the predetermined distance separating the field termination ring from the field plate is a distance in the range of approximately 25 to 300 um.

6. The reconstituted wafer package of claim 1, wherein the field plate comprises a conductive material.

7. The reconstituted wafer package of claim 1, further comprising a via formed within the first material encapsulant, wherein one of the plurality of conductive traces extends through the via for coupling to an electrical connection of a second surface of the dice.

8. The reconstituted wafer package of claim 1, wherein the dielectric layer comprises an insulating material.

9. The reconstituted wafer package of claim 8, wherein the insulating material is selected from the group consisting of a resin, epoxy, rubber, glass, silicon, ceramic, crystalline, and combinations thereof.

10. The reconstituted wafer package of claim 1, wherein the dice is a high voltage electrical component.

11. The reconstituted wafer package of claim 10, wherein the high voltage component is a device selected from the group consisting of a Field Effect Transistor (FET), a Metal Oxide Semiconductor (MOS) FET (MOSFET), an Insulated Gate FET (IGFET), a thyristor, a bipolar transistor, a diode, an MOS-controlled thyristor, a resistor, and a capacitor.

12. The reconstituted wafer package of claim 1, wherein the high voltage component is operable with a potential greater than fifty (50) volts.

13. The reconstituted wafer package of claim 1, wherein the dice is configured to receive a first positive biasing voltage having a first magnitude and the field plate is configured to receive a second positive biasing voltage having a second magnitude at least as great the first magnitude.

14. The reconstituted wafer package of claim 1, wherein dice is configured to receive a first negative biasing voltage having a first magnitude and the field plate is configured to receive a second negative biasing voltage having a second magnitude at least as great as said first magnitude.

15. The reconstituted wafer package of claim 1, wherein the first surface is a front side-face and the electrical connections are disposed on the front side-face.

16. The reconstituted wafer package of claim 1, further comprising electrical connections disposed on a back side-face wherein the back side-face is on a different plane with respect to the front side-face.

17. A reconstituted wafer package comprising:
a dice having a plurality of electrical connections;
a first material encapsulating the dice except for a first surface;
a dielectric layer formed on at least a portion of the first surface of the dice, the dielectric layer including openings for contact to the plurality of electrical connections;
a plurality of conductive traces disposed within the dielectric layer and having first and second endpoints, wherein the first endpoint of each of said plurality of conductive traces is in contact with a respective one of each of said electrical connections;
a plurality of bumps disposed on the dielectric layer, wherein each of the plurality of bumps is coupled to the second endpoints; and
a field plate disposed within the dielectric layer and interposed between the dice and the plurality of bumps, wherein the field plate is spaced apart from the dice by a distance that is defined based on a characteristic of the dielectric layer.

18. The reconstituted wafer package of claim 17, wherein the characteristic of the dielectric layer includes a dielectric strength of the dielectric layer.

19. The reconstituted wafer package of claim 17, wherein the characteristic of the dielectric layer includes a breakdown voltage of the dielectric layer.

* * * * *